US006958265B2

(12) United States Patent
Steimle et al.

(10) Patent No.: US 6,958,265 B2
(45) Date of Patent: Oct. 25, 2005

(54) SEMICONDUCTOR DEVICE WITH NANOCLUSTERS

(75) Inventors: Robert F. Steimle, Austin, TX (US); Ramachandran Muralidhar, Austin, TX (US); Wayne M. Paulson, Chandler, AZ (US); Rajesh A. Rao, Austin, TX (US); Bruce E. White, Jr., Round Rock, TX (US); Erwin J. Prinz, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 66 days.

(21) Appl. No.: 10/663,621

(22) Filed: Sep. 16, 2003

(65) Prior Publication Data

US 2005/0059213 A1 Mar. 17, 2005

(51) Int. Cl.⁷ .......................................... H01L 21/8238
(52) U.S. Cl. ...................................... 438/211; 438/257
(58) Field of Search .............................. 438/201, 211, 438/257, 258, 261

(56) References Cited

U.S. PATENT DOCUMENTS 6,297,095 B1    10/2001   Muralidhar et al.
6,320,784 B1    11/2001   Muralidhar et al.
6,444,545 B1     9/2002   Sadd et al.

OTHER PUBLICATIONS

Cavins et al., "A Nitride–Oxide Blocking Layer for Scaled SONOS Non–Volatile Memory," *Motorola, Inc.*, Jan. 10, 2002, 5 pages.

Cavins et al., "Integrated Stacked Gate Oxide and Interpoly Oxide," *Motorola, Inc.,*, Nov. 1996, pp. 93–94.

*Primary Examiner*—David A. Zarneke
(74) *Attorney, Agent, or Firm*—David G. Dolezal; Michael Balconi-Lamica (57) ABSTRACT

A process of forming a device with nanoclusters. The process includes forming nanoclusters (e.g. silicon nanocrystals) and forming an oxidation barrier layer over the nanoclusters to inhibit oxidizing agents from oxidizing the nanoclusters during a subsequent formation of a dielectric of the device. At least a portion of the oxidation barrier layer is removed after the formation of the dielectric. In one example, the device is a memory wherein the nanoclusters are utilized as charge storage locations for charge storage transistors of the memory. In this example, the oxidation barrier layer protects the nanoclusters from oxidizing agents due to the formation of gate dielectric for high voltage transistors of the memory.

45 Claims, 5 Drawing Sheets

SEMICONDUCTOR DEVICE WITH NANOCLUSTERS

BACKGROUND OF THE INVENTION

1. Field of the Invention

This invention relates to devices with nanoclusters.

2. Description of the Related Art

Some devices such as memories (e.g. non volatile memories) utilize discrete charge storage elements called nanoclusters (e.g. of silicon, aluminum, gold, or germanium) for storing charge in a charge storage location of a transistor. In some examples, the nanoclusters are located between two dielectric layers, a bottom dielectric and a control dielectric. Examples of such transistors include thin film storage transistors. A memory typically includes an array of such transistors. Examples of nanocluster types includes silicon nanocrystals, germanium nanocrystals, gold nanoclusters, and aluminum nanoclusters. In some examples, nanoclusters are from 10–100 Angstroms in sized and may be of doped or undoped semiconductor material or made of conductive materials.

Some memories that have charge storage transistors with nanoclusters are implemented on integrated circuits that also include high voltage transistors in the circuitry used for charging and discharging the charge storage locations of the charge storage transistors. Charging or discharging the charge storage locations is used to store one or more bits of information, and may be referred to as programming or erasing. These high voltage transistors typically include a relatively thick gate oxide. This gate oxide may be grown by a steam oxidation process. This steam oxidation process may penetrate the control dielectric of the charge storage transistors thereby undesirably oxidizing the nanocrystals and undesirably increasing the bottom dielectric thickness.

What is needed is an improved method for making a device with nanoclusters.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates identical items unless otherwise noted. The views shown in the Figures are not necessarily drawn to scale.

DETAILED DESCRIPTION

The following sets forth a detailed description of a mode for carrying out the invention. The description is intended to be illustrative of the invention and should not be taken to be limiting.

FIGS. 1–6 show partial side views of a semiconductor wafer during stages in the manufacture of a memory including nanoclusters according to a first embodiment of the present invention. As will be described later, the method includes utilizing an oxidation barrier layer for inhibiting the oxidation of the nanoclusters and bottom dielectric.

Figure 1:
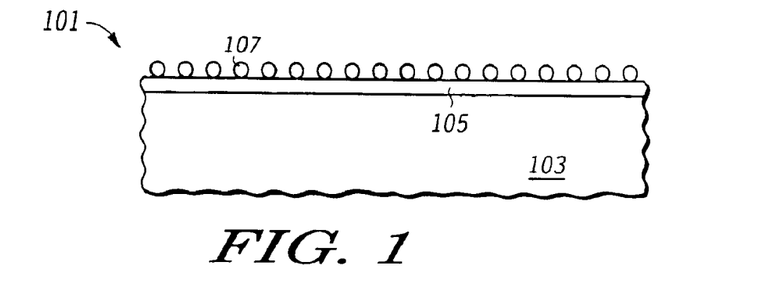
FIG. 1 is a partial side view of a semiconductor wafer during a stage in the manufacture of an integrated circuit according to a first embodiment of the present invention.

Referring to FIG. 1, wafer 101 includes a semiconductor substrate 103. A bottom dielectric 105 (e.g. of silicon dioxide, silicon oxynitride, hafnium oxide, aluminum oxide, lanthanum oxide, or lanthanum silicate) has been formed over substrate 103 e.g. by oxidation or chemical vapor deposition. In one embodiment, bottom dielectric has thickness of 5 nanometers, but may be of other thicknesses in other embodiments. A layer of nanoclusters 107 (e.g. of silicon, aluminum, gold, germanium, or a silicon and germanium alloy or other types of conductive material or doped or undoped semiconductive material) is formed over bottom dielectric 105 by e.g. chemical vapor deposition techniques, aerosol deposition techniques, spin on coating techniques, or self assembly techniques such e.g. annealing a thin film to form nanoclusters. In one embodiment, the nanoclusters 107 are silicon nanocrystals. In one embodiment where the nanoclusters are utilized in a non volatile memory, the nanoclusters have a planar density of $1 \times 10^{12}$ $cm^{2}$ with a size of 5 to 7 nanometers. In some embodiments, nanoclusters are from 10–100 Angstroms in size. However the nanoclusters in other embodiments may be of other sizes and/or other densities. Nanoclusters 107 will be utilized for implementing charge storage locations in transistors (not shown) of a memory fabricated on wafer 101.

Figure 2:
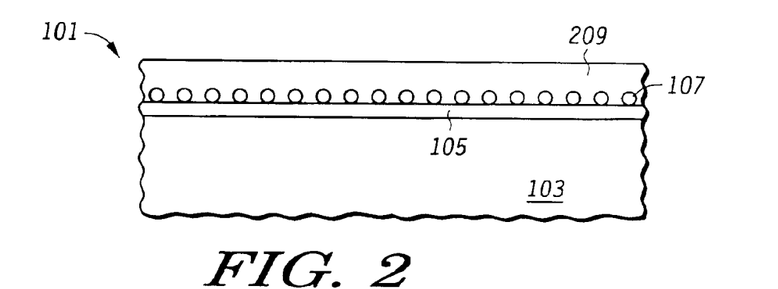
FIG. 2 is a partial side view of a semiconductor wafer during another stage in the manufacture of an integrated circuit according to the first embodiment of the present invention.

Referring to FIG. 2, a layer of dielectric material (e.g. silicon dioxide, silicon oxynitride, hafnium oxide, aluminum oxide, lanthanum oxide, and lanthanum silicate) is formed over wafer 101 by e.g. chemical vapor deposition to form a control dielectric 209. In one embodiment, control dielectric 209 has a thickness of 5–10 nanometers, but may be of other thicknesses in other embodiments.

In some embodiments, the bottom dielectric 105, nanoclusters 107, and control dielectric 209 may be formed by ion implantation (e.g. silicon or germanium) into a layer of dielectric material (not shown) followed by the annealing of the ions to form nanocrystals in the layer of dielectric material. In other embodiments, bottom dielectric 105, nanoclusters 107 and control dielectric 209 may be formed by recrystallization of a silicon rich oxide layer between two layers of dielectric material to form the nanoclusters. In other embodiments, the nanoclusters may be implemented in multiple layers located above the bottom dielectric. In other embodiments, the nanoclusters are formed by depositing a thin amorphous layer of nanocluster material (e.g. 1–5 nanometers) wherein the resultant structure is annealed is a subsequent annealing processor.

In other embodiments, a thin (e.g. 0.5 nanometers) passivation layer (not shown) made of e.g. nitrided silicon oxide may be located on the nanoclusters, wherein control dielectric 209 is formed over the passivation layer.

Figure 3:
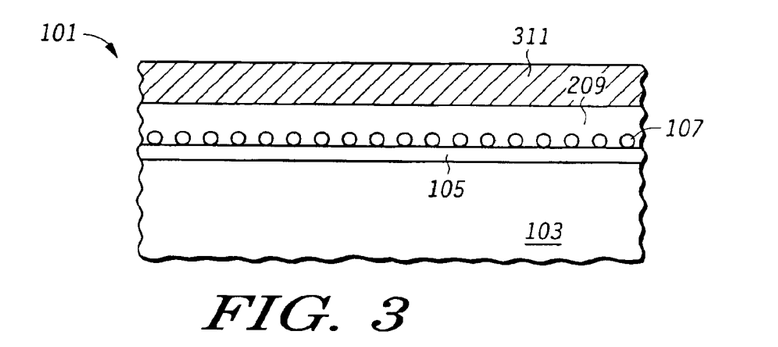
FIG. 3 is a partial side view of a semiconductor wafer during another stage in the manufacture of an integrated circuit according to the first embodiment of the present invention.

Referring to FIG. 3, an oxidation barrier layer 311 is deposited over wafer 101. In one embodiment, layer 311 is made of silicon nitride. In other embodiments barrier layer 311 may include any material or combinations thereof that retard the diffusion of the oxidizing agent to the control dielectric surface. Such materials may include silicon nitride, silicon oxynitride, silicon, silicon germanium alloys, high K dielectrics e.g. hafnium oxide, lanthanum oxide, lanthanum aluminate, tantalum pentoxide, zirconium silicate, lanthanum silicate, aluminum oxide, zirconium oxide, zirconium silicate, tantalum oxide, and titanium oxide and metals that are generally impervious to the passing of an oxidizing agent. Examples of such metals include tantalum, tungsten silicide, molybdenum silicide, nickel, nickel silicide, cobalt, cobalt silicide, iridium, iridium oxide, ruthenium, ruthenium oxide, and titanium.

In one embodiment, barrier layer 311 is 9 nanometers thick. In other embodiments, layer 311 may be of other thickness. In some embodiments, layer 311 may have a thickness of 2 nanometers of greater. In one embodiment, barrier layer 311 is thick enough to be continuous with no "pin hole" defects for oxygen to penetrate beneath barrier layer 311. In other embodiments, barrier layer 311 is of a material able to withstand temperatures of a furnace oxidation process (e.g. 600° C. and greater).

Figure 4:
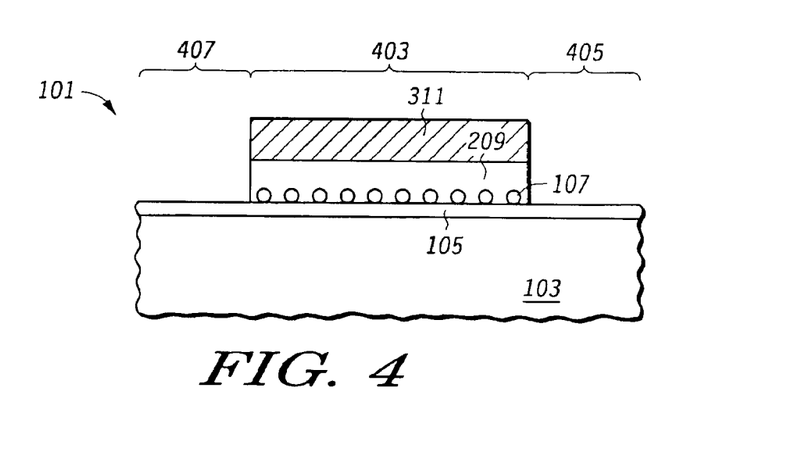
FIG. 4 is a partial side view of a semiconductor wafer during another stage in the manufacture of an integrated circuit according to the first embodiment of the present invention.

Referring to FIG. 4, layer 311, control dielectric 209, nanoclusters 107, and bottom dielectric 105 are patterned to leave those structures in the memory array areas (e.g. 403) of wafer 101 and to remove those structure from other areas (e.g. high voltage area 405) of wafer 101. In one embodiment, layer 311 is removed by a dry etch, and control dielectric 209, nanoclusters 107, and bottom dielectric 105 are removed by wet etch. In another embodiment, a combination of wet and dry etches may be used. Multiple transistors may be formed in memory area 403 during later processes.

Figure 5:
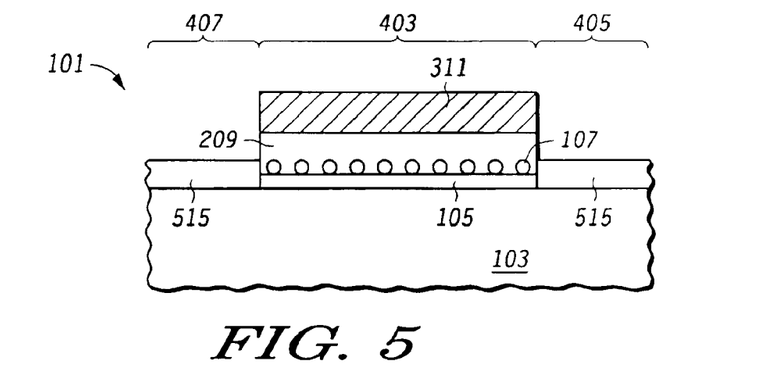
FIG. 5 is a partial side view of a semiconductor wafer during another stage in the manufacture of an integrated circuit according to the first embodiment of the present invention.

Referring to FIG. 5, a high voltage dielectric 515 is grown on substrate 103 in high voltage areas 407 and 405. Dielectric 515 will be utilized as a gate dielectric for high voltage transistors (not shown) that, in some embodiments, are utilized to implement programming and erase circuitry for charging and discharging the charge storing transistors to be formed in memory area 403. In one embodiment, dielectric 515 is grown by exposing wafer 101 to high temperature steam and oxygen or nitrous oxide to oxidize the exposed semiconductor material of substrate 103 in areas 407 and 405. In one embodiment, dielectric 515 has a thickness of between 7–14 nanometers, but may have other thicknesses in other embodiments. In other embodiments, dielectric 515 may be formed by a blanket deposition over wafer 101 followed by the removal of the dielectric over area 403.

During the formation of dielectric 515, barrier layer 311 inhibits oxidizing agents from penetrating into control dielectric 209, nanoclusters 107, and bottom dielectric 105. Providing a method that includes a barrier layer over nanoclusters to inhibit oxidizing agents from penetrating to the nanoclusters, control dielectric, and bottom dielectric may provide for a method that minimizes the oxidation of the nanoclusters and/or thickening of the bottom dielectric during oxidation forming processes.

Figure 6:
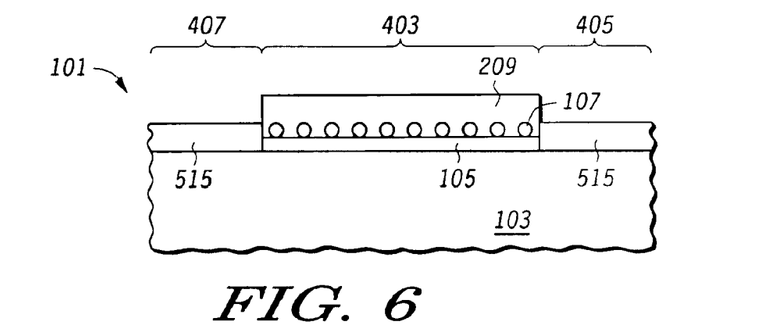
FIG. 6 is a partial side view of a semiconductor wafer during another stage in the manufacture of an integrated circuit according to the first embodiment of the present invention.

Referring to FIG. 6, after the growth of high voltage dielectric 515, barrier layer 311 is removed. In one embodiment, barrier layer 311 is removed by a selective wet etch. In other embodiments, the wafer is patterned to expose barrier layer 311 and protect dielectric 515. After layer 311 is removed by a wet etch or dry etch, the patterning material is removed.

In subsequent processes (not shown), charge storage transistors are formed in area 403 and high voltage transistors are formed in areas 405 and 407. In other embodiments, other types of transistors may be formed in areas 407 and 405, such as transistors for circuit logic and input/output circuitry of the integrated circuit. Portions of nanoclusters 107 are utilized to form the charge storage locations of the charge storing transistors of a memory. In subsequent processes of some embodiments, a layer of gate material is deposited over wafer 101. The layer of gate material, nanoclusters 107 and control dielectric 209 are then patterned in area 405 to form the gates, charge storage locations, and control dielectric of the charge storage transistors.

Figure 7:
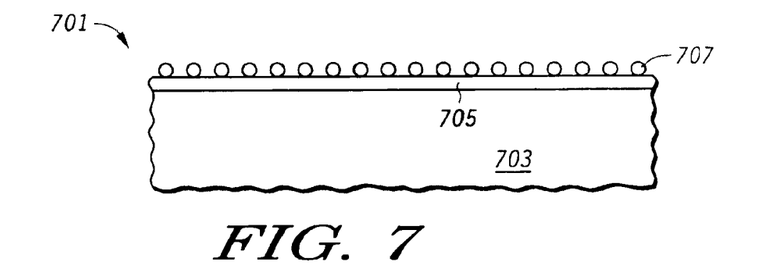
FIG. 7 is a partial side view of a semiconductor wafer during a stage in the manufacture of an integrated circuit according to a second embodiment the present invention.

FIGS. 7–11 show partial side views of a semiconductor wafer during stages in the manufacture of a memory including nanoclusters according to a second embodiment of the present invention. Referring to FIG. 7, a bottom dielectric 705 is formed over a substrate 703 of wafer 701. Nanoclusters 707 are then formed over wafer 701.

Figure 8:
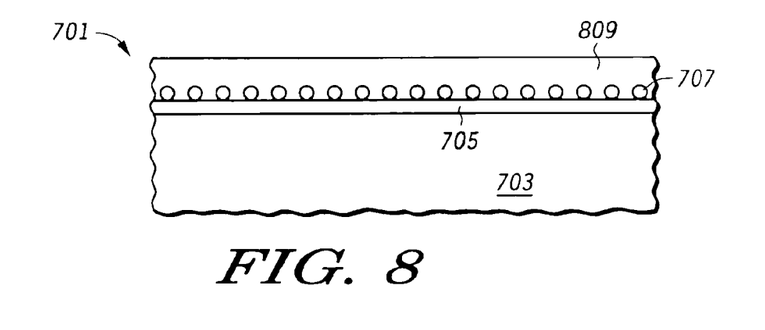
FIG. 8 is a partial side view of a semiconductor wafer during another stage in the manufacture of an integrated circuit according to the second embodiment of the present invention.

Referring to FIG. 8, an oxidation barrier layer 809 is deposited over wafer 701 on nanoclusters 707. The oxidation barrier layer 809 is of a different material than of nanoclusters 707. In one embodiment layer 809 includes silicon nitride, but in other embodiments, layer 809 may include other materials e.g. such as those described above with respect to layer 311.

Figure 9:
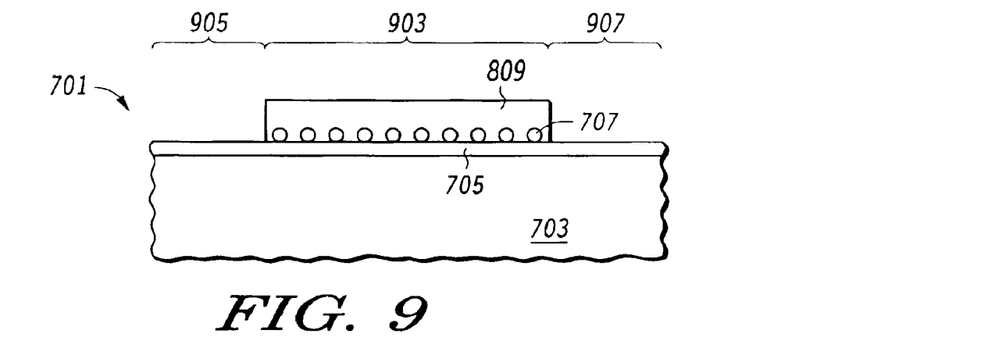
FIG. 9 is a partial side view of a semiconductor wafer during another stage in the manufacture of an integrated circuit according to the second embodiment of the present invention.

Referring to FIG. 9, layer 809, nanoclusters 707, and bottom dielectric 705 are patterned to leave those structures in the memory array areas (e.g. 903) and to remove those structures from other areas (e.g. high voltage area 905).

Figure 10:
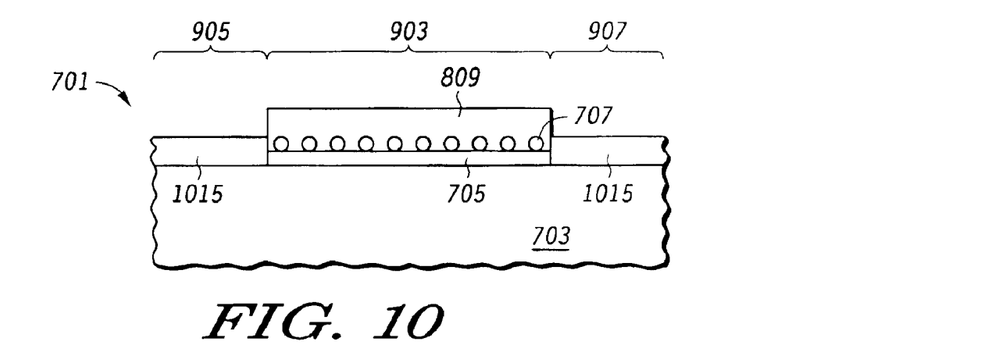
FIG. 10 is a partial side view of a semiconductor wafer during another stage in the manufacture of an integrated circuit according to the second embodiment of the present invention.

Referring to FIG. 10, a dielectric layer 1015 is grown in areas 905 and 907 by the oxidation of the exposed semiconductor substrate 703. During the oxidation of the exposed semiconductor substrate 703, barrier layer 809 inhibits oxidizing agents from penetrating into nanoclusters 707 and bottom dielectric 705. As will be described later, dielectric layer 1015 will be utilized to form a portion of the gate dielectric for transistors formed in areas 905 and 907.

Figure 11:
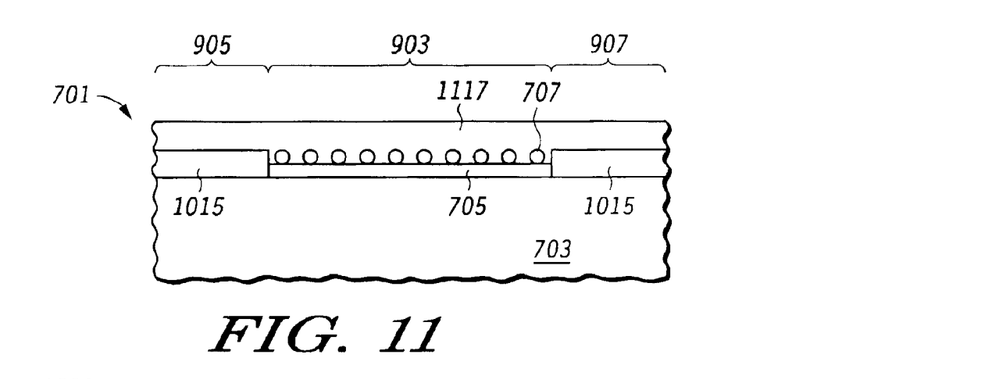
FIG. 11 is a partial side view of a semiconductor wafer during another stage in the manufacture of an integrated circuit according to the second embodiment of the present invention.

Referring to FIG. 11, after the growth of layer 1015, barrier layer 809 is removed and dielectric layer 1117 is deposited over wafer 701 including over layer 1015 and nanoclusters 707. In one embodiment, layer 809 is removed by a wet nitride strip, but may be removed by other techniques in other embodiments. In one embodiment, dielectric layer 1117 is made of silicon dioxide deposited by chemical vapor deposition. Dielectric layer 1117 is utilized as the control dielectric for transistors formed in memory array area 903. Dielectric layer 1117 also serves as a portion of the gate dielectric (along with dielectric layer 1015) for transistors formed in areas 905 and 907.

In subsequent processes (not shown), charge storage transistors are formed in area 903 and high voltage transistors (and/or other types of transistors) are formed in areas 905 and 905. Portions of the nanoclusters 707 are utilized to form the charge storage locations of the charge storage transistors of a memory. In subsequent processes of some embodiments, a layer of gate material is deposited over wafer 101. The layer of gate material, nanoclusters 107 and control dielectric 209 are then patterned in area 903 to form the gates and charge storage locations of the charge storage transistors formed in that area. The layer of gate material may be patterned to form the gates of the transistors formed in areas 905 and 907.

Figure 12:
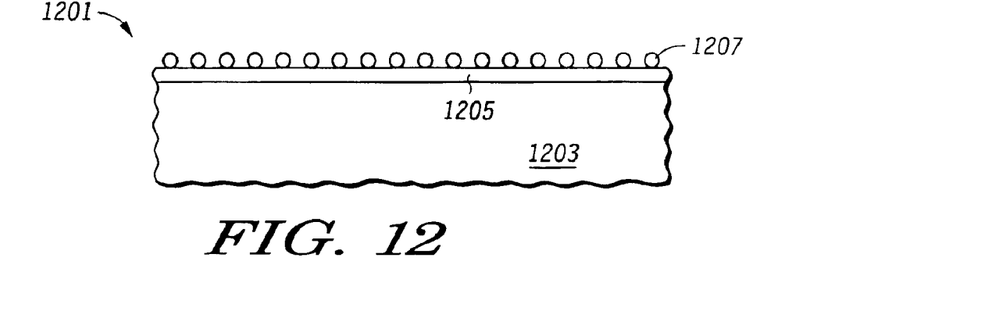
FIG. 12 is a partial side view of a semiconductor wafer during a stage in the manufacture of an integrated circuit according to a third embodiment of the present invention.

FIGS. 12–18 show partial side views of a semiconductor wafer during stages in the manufacture of a memory including nanoclusters according to a third embodiment of the present invention. Referring to FIG. 12, a bottom dielectric 1205 is formed over a substrate 1203 of wafer 1201. Nanoclusters 1207 are then formed over wafer 101.

Figure 13:
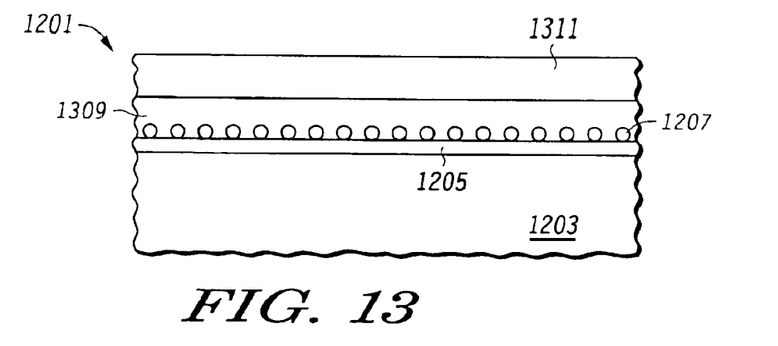
FIG. 13 is a partial side view of a semiconductor wafer during another stage in the manufacture of an integrated circuit according to the third embodiment of the present invention.

Referring to FIG. 13, a layer of dielectric material (e.g. silicon dioxide) is formed over wafer 1201 by e.g. chemical vapor deposition to form control dielectric 1309. In one embodiment, control dielectric 1309 has a thickness of 5–10 nanometers, but may have other thickness in other embodiments. An oxidation barrier layer 1311 is then deposited over wafer 1201 on dielectric 1309. In one embodiment, layer 1311 includes silicon nitride, but in other embodiments, layer 1311 may include other materials e.g. as those described above with respect to layer 311.

Figure 14:
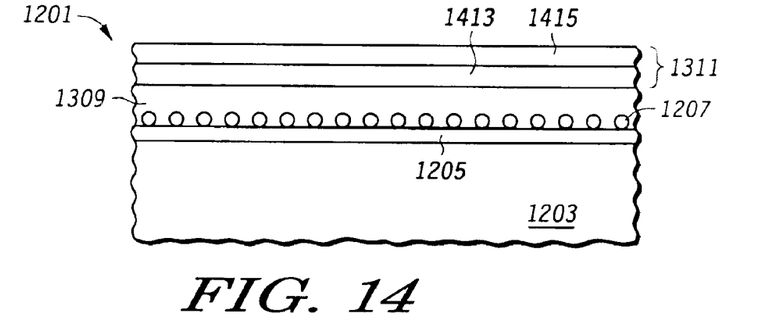
FIG. 14 is a partial side view of a semiconductor wafer during another stage in the manufacture of an integrated circuit according to the third embodiment of the present invention.

Referring to FIG. 14, the top portion of barrier layer 1311 is oxidized to form oxidized portion 1415 leaving a remaining portion 1413 of layer 1311. In one embodiment, layer 1311 is oxidized using a steam oxidation process. In one embodiment where barrier layer 1311 is 8.5 nanometers thick and is made of silicon nitride, the steam oxidation process results in portion 1415 being approximately 3–5 nanometers thick and generally made of silicon dioxide. The top portion of portion 1413 includes an oxynitride. The bottom portion of portion 1413 is predominately silicon nitride.

The steam oxidation process reduces the thickness of the barrier layer (e.g. from 8.5 nanometers to less than 4 nanometers) as well as reduces the charge storing capacity of portion 1413. Accordingly, for charge storage transistors formed on wafer 1201, the predominate charge storing structures will be nanoclusters 1207, and not the silicon nitride (or other material) of portion 1413. Any charge stored in portion 1413 will only have a small effect on the threshold voltage of a transistor as portion 1413 is in close proximity to the gate of the transistor.

Figure 15:
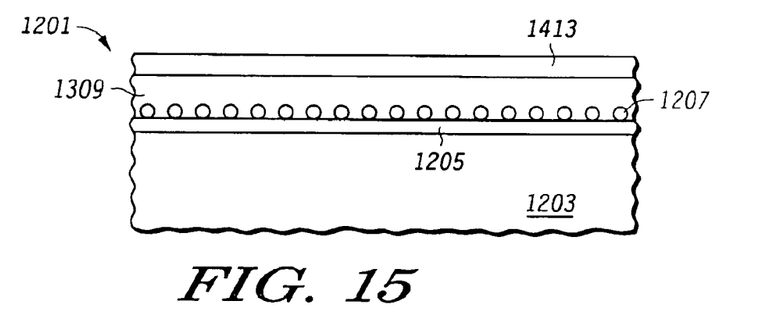
FIG. 15 is a partial side view of a semiconductor wafer during another stage in the manufacture of an integrated circuit according to the third embodiment of the present invention.

FIG. 15 shows wafer 1201 after portion 1415 has been removed. In one embodiment, portion 1415 is removed by a wet etch (e.g. one part HF to 50 parts water) or by dry etch.

Figure 16:
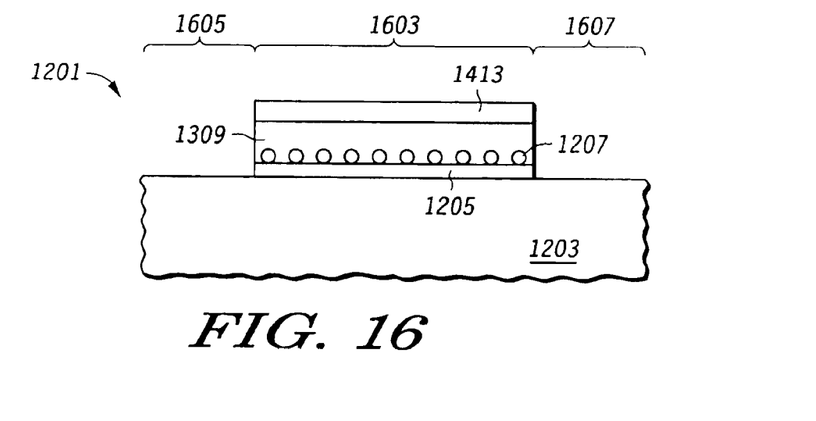
FIG. 16 is a partial side view of a semiconductor wafer during another stage in the manufacture of an integrated circuit according to the third embodiment of the present invention.

Referring to FIG. 16, portion 1413, control dielectric 1309, nanoclusters 1207, and bottom dielectric 1205 are patterned to leave those structures in the memory array areas (e.g. 1603) and to remove those structures from other areas (e.g. high voltage area 1605). In one embodiment, portion 1413 is removed by a dry etch, and control dielectric 1309, nanoclusters 1207, and bottom dielectric 1205 are removed by a wet etch. Multiple transistors are formed in memory area 1603 during later processes.

Figure 17:
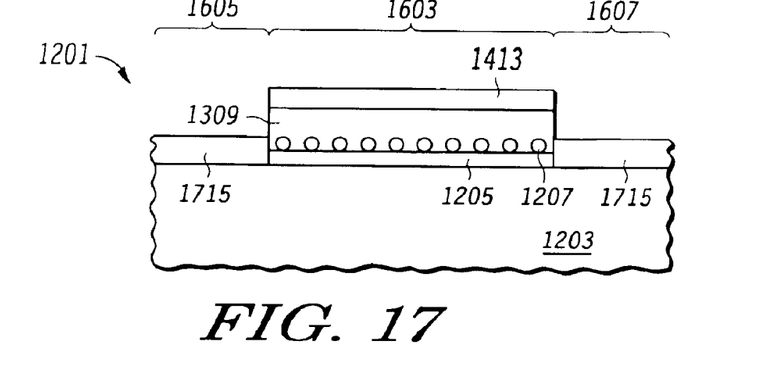
FIG. 17 is a partial side view of a semiconductor wafer during another stage in the manufacture of an integrated circuit according to the third embodiment of the present invention.

Referring to FIG. 17, a high voltage dielectric 1715 is grown in high voltage areas 1607 and 1605. Dielectric 1715 will be utilized as a gate dielectric for high voltage transistors (not shown), which in some embodiments, are utilized to implement programming and erase circuitry for programming and erasing the charge storing transistors to be formed in memory area 1603. In one embodiment, dielectric 1715 is 10 nanometers thick.

During the formation of dielectric 1715, barrier portion 1413 inhibits oxidizing agents from penetrating into control dielectric 1309, nanoclusters 1207, and bottom dielectric 1205.

Figure 18:
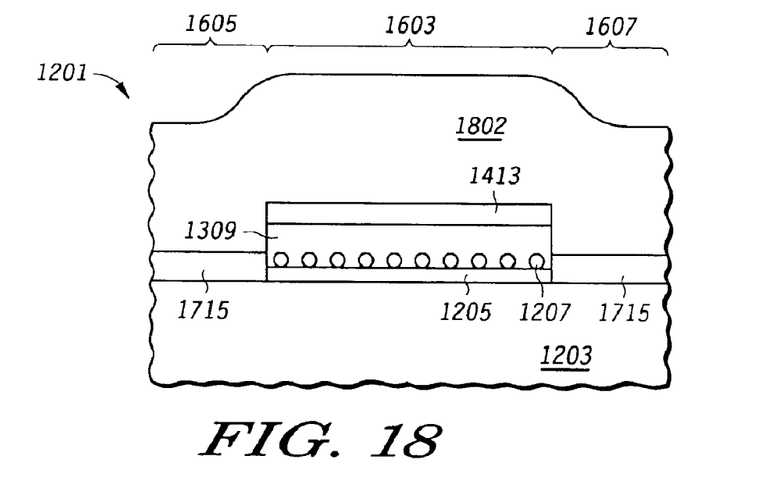
FIG. 18 is a partial side view of a semiconductor wafer during another stage in the manufacture of an integrated circuit according to the third embodiment of the present invention.

Referring to FIG. 18, a layer 1802 of gate material is deposited over wafer 1201 including over portion 1413 in the memory array area 1603. In subsequent processes, layer 1802, portion 1413, control dielectric 1309, nanoclusters 1207, and bottom dielectric 1205 are pattered to form the gates, control dielectric, charge storage locations, and bottom dielectric of the charge storage transistors in area 1603. Also, layer 1802 and dielectric 1715 are patterned to form the gates and gate dielectric of the transistors (e.g. high voltage transistors) in areas 1605 and 1607.

In one embodiment, bottom dielectric 1205 is 5 nanometers thick, control dielectric 1309 is 5 nanometers thick, and portion 1413 is 4 nanometers thick. However, these structures may be of other thicknesses in other embodiments.

In some embodiments, the threshold voltage shift due to charge trapping in portion 1413 of a charge storage transistor may be limited by the partial oxidation of portion 1413, the reduction in thickness of portion 1413, and the proximately of portion 1413 to the gate electrode (the portion of layer 1802 used to form the gate of a charge storage transistor).

One advantage that may occur with some embodiments utilizing the method set forth in FIGS. 12–18 is that a nitride strip is not necessary for removing the barrier layer portion 1413 (where layer 1311 is made of silicon nitride). This may provide for better process control of both the control dielectric (1309) thickness and gate dielectric (1715) thickness.

Figure 19:
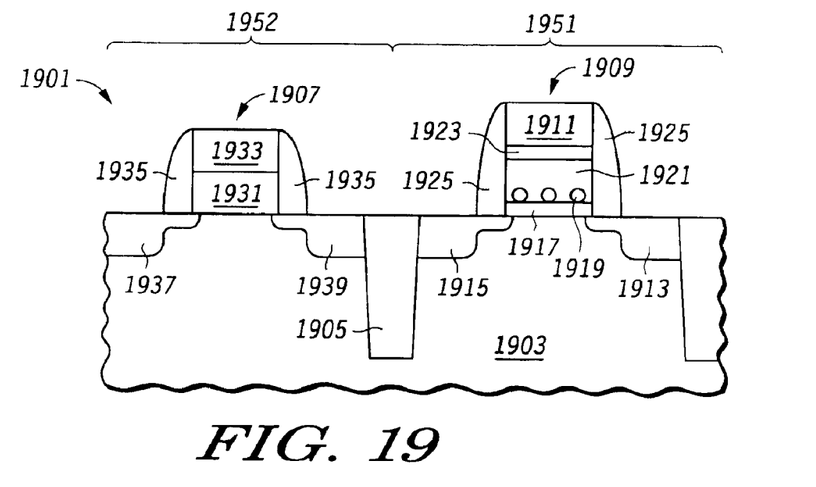
FIG. 19 is a partial side view of a semiconductor wafer according to the present invention according to the present invention.

FIG. 19 is a side view of a wafer including both a high voltage transistor and a charge storage transistor made from a method similar to that set forth in FIGS. 12–18. Charge storage transistor 1909 is formed in a memory array area 1951 of wafer 1901. Transistor 1909 includes a gate 1911, partial diffusion barrier portion 1923, control dielectric 1921, nanoclusters 1919, bottom dielectric 1917, and spacers 1925. Source/drain regions 1915 and 1913 are formed in substrate 1903 by e.g. ion implantation. Portion 1923 is formed from diffusion barrier layer portion (e.g. 1413). In one embodiment, transistor 1909 is utilized in a non volatile, electrically erasable read only memory (EEPROM).

Transistor 1907 is a high voltage transistor formed in area 1952. Transistor 1907 includes gate 1933, gate dielectric 1931, spacers 1935 and source and drain regions 1937 and 1939. Gate dielectric 1931 is formed from the gate dielectric layer (e.g. 1602) grown on the exposed portion of the substrate after the formation of the portion from which portion 1923 is formed. An isolation region 1905 is located in substrate 1903 for isolating transistors 1907 and 1909.

In one embodiment, transistor 1907 is a transistor in a program or erase circuit for programming and/or erasing the charge stored in nanoclusters 1919. Transistor 1907 is characterized as a high voltage transistor in that it operates at a voltage above the transistors of the input output devices and logic circuits of the integrated circuit. In one embodiment, transistor 1907 operates at 6 volts for providing programming and erase voltages to store charge in charge storage transistor 1909 wherein the transistors of the input/output devices and other logic (not shown) operate at 1.2 volts. Transistor 1907 may also be an input/output transistor operating at 2.5V or 3.3 V.

Although the utilization of an oxygen diffusion barrier for inhibiting oxidizing agent from oxidizing nanoclusters is shown in making a memory, the same or similar processes as described above may be utilized in the manufacture of other devices that utilize nanoclusters such as e.g. opto electronic devices.

In one embodiment, a method of making a device includes providing a substrate, forming nanoclusters over the substrate, depositing an oxidation barrier layer over the nanoclusters, and patterning to form a first area and a second area. The first area includes the oxidation barrier layer and the nanoclusters over the substrate. The second area has the oxidation barrier layer and the nanoclusters removed. The method also includes forming a second dielectric over the first area subsequent to the patterning. The method further includes removing at least a portion of the oxidation barrier layer from the first area subsequent to the forming the second dielectric. The removing the at least a portion at least reduces a thickness of the oxidation barrier layer.

In another embodiment, a method of making a device includes providing a substrate having a structure of nanoclusters and dielectric over the substrate, depositing an oxidation barrier layer over the structure, and patterning to form a first area and a second area. The first area includes the oxidation barrier layer and the structure over the substrate. The second area has the oxidation barrier layer and at least the nanoclusters of the structure removed. The method also includes forming a second dielectric over the first area subsequent to forming the patterning and removing at least a portion of the oxidation barrier layer from the first area subsequent to the forming the second dielectric. The removing the at least a portion at least reduces a thickness of the oxidation barrier layer.

In another embodiment, a method of making a semiconductor device includes providing a substrate having a structure of nanoclusters and dielectric overlying the substrate and depositing an oxidation barrier layer over the structure. The oxidation barrier layer includes at least one selected from a group consisting of silicon nitride, silicon oxynitride, silicon, a silicon germanium alloy, a high-K dielectric material, and a metal. The method also includes patterning to form a first area and a second area. The first area including portions of the oxidation barrier layer and the structure, and the second area has portions of the oxidation barrier layer and at least the nanoclusters of the structure removed. The method also includes forming a second dielectric in the second area subsequent to the patterning and removing at least a portion of the oxidation barrier layer from the first area subsequent to the forming the second dielectric. The removing the at least a portion at least reduces a thickness of the oxidation barrier layer.

In another embodiment, a method of making a semiconductor memory includes providing a substrate having a structure of nanoclusters and dielectric overlying the substrate, depositing an oxidation barrier layer over the structure, and patterning to form a first area and a second area. The first area includes portions of the oxidation barrier layer and the structure, and the second area has portions of the oxidation barrier layer and at least the nanoclusters of the structure removed. The method further includes forming a second dielectric outside the first area subsequent to the patterning and removing at least a portion of the oxidation barrier layer from the first area subsequent to the forming the second dielectric. The removing the at least a portion at least reduces a thickness of the oxidation barrier layer. The method still further includes forming a charge storage transistor in the first area. At least a portion of the nanoclusters is utilized as a charge storage location for the charge storage transistor. The method also includes forming a second transistor in the second area. A portion of the second dielectric serves at least as a portion of a gate dielectric of the second transistor.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of making a device comprising:
   providing a substrate;
   forming nanoclusters over the substrate;
   depositing an oxidation barrier layer over the nanoclusters;
   patterning to form a first area and a second area, the first area including the oxidation barrier layer and the nanoclusters over the substrate, and the second area having the oxidation barrier layer and the nanoclusters removed;
   forming a second dielectric over the second area subsequent to the patterning; and
   removing at least a portion of the oxidation barrier layer from the first area, wherein the removing the at least a portion at least reduces a thickness of the oxidation barrier layer.

2. The method of claim 1, wherein the nanoclusters include at least one selected from a group consisting of silicon nanocrystals, germanium nanocrystals, silicon and germanium alloy nanocrystals, and metal nanocrystals.

3. The method of claim 1 wherein the forming the second dielectric includes subjecting the oxidation barrier layer to a temperature of 600° C. or greater.

4. The method of claim 1, wherein the oxidation barrier layer includes at least one selected from a group consisting of silicon nitride, silicon oxynitride, silicon, a silicon germanium alloy, a high-K dielectric material, and a metal.

5. The method of claim 4, wherein the high-K dielectric material includes at least one selected from a group consisting of hafnium oxide, lanthanum oxide, lanthanum aluminate, tantalum pentoxide, zirconium silicate, lanthanum silicate, aluminum oxide, zirconium oxide, zirconium silicate, tantalum oxide, and titanium oxide.

6. The method of claim 4, wherein the metal includes at least one selected from a group consisting of tantalum, tungsten silicide, molybdenum suicide, nickel, nickel silicide, cobalt, cobalt silicide, iridium, iridium oxide, ruthenium, ruthenium oxide, and titanium.

7. The method of claim 1, wherein the oxidation barrier layer has a thickness of 2 nanometers or greater.

8. The method of claim 1, further comprising: forming transistors in the first and second areas.

9. The method of claim 8, wherein transistors in the first area include charge storage transistors, wherein portions of the nanoclusters are utilized as charge storage locations for the charge storage transistors.

10. The method of claim 8, wherein the transistors in the second area includes transistors having a gate dielectric that includes portions of the second dielectric.

11. The method of claim 1, wherein the removing at least a portion of the oxidation barrier layer from the first area includes removing at least substantially all of the oxidation barrier layer from the first area.

12. The method of claim 1, wherein the oxidation barrier layer includes a first layer portion and a second layer portion located above the first layer portion, wherein the removing at least a portion of the oxidation barrier layer from the first area includes removing the second layer portion with the first layer portion remaining.

13. The method claim 12 wherein the oxidation barrier layer is oxidized to form the second layer portion.

14. The method of claim 12 wherein the first layer portion is 5 nanometers or less.

15. The method of claim 12 wherein the removing the second layer portion further includes etching the second layer portion with an etch.

16. The method of claim 12 further comprising:
forming a layer of gate material over the first layer portion subsequent to the removing the second layer portion.

17. A method of making a device comprising:
providing a substrate having a structure of nanoclusters and dielectric over the substrate;
depositing an oxidation barrier layer over the structure;
patterning to form a first area and a second area, the first area including the oxidation barrier layer and the structure over the substrate, and the second area having the oxidation barrier layer and at least the nanoclusters of the structure removed;
forming a second dielectric over the second area subsequent to the patterning; and
removing at least a portion of the oxidation barrier layer from the first area, wherein the removing the at least a portion at least reduces a thickness of the oxidation barrier layer.

18. The method of claim 17, wherein the nanoclusters of the structure include at least one selected from a group consisting of silicon nanocrystals, germanium nanocrystals, silicon and germanium alloy nanocrystals, and metal nanocrystals.

19. The method of claim 17 wherein the forming the second dielectric includes subjecting the oxidation barrier layer to a temperature of 600° C. or greater.

20. The method of claim 17, wherein the structure is formed by a method comprising:
forming a bottom dielectric layer over the substrate;
forming nanoclusters over the bottom dielectric layer; and
forming a control dielectric layer over the nanoclusters.

21. The method of claim 20, wherein the bottom dielectric layer and control dielectric layer each include one selected from a group consisting of silicon dioxide, silicon oxynitride, hafnium oxide, aluminum oxide, lanthanum oxide, and lanthanum silicate.

22. The method of claim 17, wherein the nanoclusters are formed by a method comprising:
implanting nanocluster material within the dielectric and subsequently annealing the structure to induce phase separation to form nanoclusters.

23. The method of claim 17, wherein the structure is formed by a method comprising:
forming a bottom dielectric over the substrate;
depositing at least one layer of nanocluster material over the bottom dielectric;
forming a control dielectric over the at least one nanocluster material layer; and
annealing the at least one layer of nanocluster material to form nanoclusters.

24. The method of claim 17, wherein the device includes a memory and wherein the first area includes a memory array area.

25. The method of claim 17, wherein the oxidation barrier layer includes at least one selected from a group consisting of silicon nitride, silicon oxynitride, silicon, a silicon germanium alloy a high-K dielectric material, and a metal.

26. The method of claim 25, wherein the high-K dielectric material includes at least one selected from a group consisting of hafnium oxide, lanthanum oxide, lanthanum aluminate, tantalum pentoxide, zirconium silicate, lanthanum silicate, aluminum oxide, zirconium oxide, zirconium silicate, tantalum oxide, and titanium oxide.

27. The method of claim 25, wherein the metal includes at least one selected from a group consisting of tantalum, tungsten silicide, molybdenum silicide, nickel, nickel silicide, cobalt, cobalt silicide, iridium, iridium oxide, ruthenium, ruthenium oxide, and titanium.

28. The method of claim 17, wherein the oxidation barrier layer has a thickness of 2 nanometers or greater.

29. The method of claim 17, further comprising:
forming transistors in the first and second areas.

30. The method of claim 29, wherein transistors in the first area include charge storage transistors, wherein portions of the nanoclusters are utilized as charge storage locations for the charge storage transistors.

31. The method of claim 29, wherein the transistors in the second area includes at transistors having a gate dielectric that includes portions of the second dielectric.

32. The method of claim 31 wherein transistors in the first area include charge storage transistors having a bottom dielectric having a thickness, wherein gate dielectrics of transistors of the second area have a thickness greater than the thickness of the bottom dielectric.

33. The method of claim 17, wherein the removing at least a portion of the oxidation barrier layer from the first area includes removing at least substantially all of the oxidation barrier layer from the first area.

34. The method of claim 17, wherein the oxidation barrier layer includes a first layer portion and a second layer portion located above the first layer portion, wherein the removing at least a portion of the oxidation barrier layer from the first area includes removing the second layer portion with the first layer portion remaining.

35. The method claim 34 wherein the oxidation barrier layer is oxidized to form the second layer portion.

36. The method of claim 34 wherein the first layer portion is 4 nanometers or less.

37. The method of claim 34 wherein the removing the second layer portion further includes etching the second layer portion with an etch.

38. The method of claim 34 further comprising:
  forming a layer of gate material over the first layer portion subsequent to the removing the second layer portion.

39. A method of making a semiconductor device comprising:
  providing a substrate having a structure of nanoclusters and dielectric overlying the substrate;
  depositing an oxidation barrier layer over the structure, wherein the oxidation barrier layer includes at least one selected from a group consisting of silicon nitride, silicon oxynitride, silicon, a silicon germanium alloy, a high-K dielectric material, and a metal;
  patterning to form a first area and a second area, the first area including portions of the oxidation barrier layer and the structure, and the second area having portions of the oxidation barrier layer and at least the nanoclusters of the structure removed;
  forming a second dielectric in the second area subsequent to the patterning; and
  removing at least a portion of the oxidation barrier layer from the first area subsequent to the forming the second dielectric, wherein the removing the at least a portion at least reduces a thickness of the oxidation barrier layer.

40. A method of making a semiconductor memory comprising:
  providing a substrate having a structure of nanoclusters and dielectric overlying the substrate;
  depositing an oxidation barrier layer over the structure;
  patterning to form a first area and a second area, the first area including portions of the oxidation barrier layer and the structure, and the second area having portions of the oxidation barrier layer and at least the nanoclusters of the structure removed;
  forming a second dielectric outside the first area subsequent to the patterning;
  removing at least a portion of the oxidation barrier layer from the first area subsequent to the forming the second dielectric, wherein the removing the at least a portion at least reduces a thickness of the oxidation barrier layer;
  forming a charge storage transistor in the first area, wherein at least a portion of the nanoclusters is utilized as a charge storage location for the charge storage transistor;
  forming a second transistor in the second area, wherein a portion of the second dielectric serves at least as a portion of a gate dielectric of the second transistor.

41. The method of claim 40 wherein the oxidation barrier layer includes at least one selected from a group consisting of silicon nitride, silicon oxynitride, silicon, a silicon germanium alloy, a high-K dielectric material, and a metal.

42. The method of claim 1 wherein the removing at least a portion of the oxidation barrier layer from the first area further includes removing at least a portion of the oxidation barrier layer from the first area subsequent to the forming the second dielectric.

43. The method of claim 1 wherein the forming the second dielectric over the second area subsequent to the patterning includes forming the second dielectric over the first area subsequent to the patterning.

44. The method of claim 17 wherein the forming the second dielectric over the second area subsequent the patterning further includes forming the second dielectric over the first area subsequent the patterning.

45. The method of claim 17 wherein the removing at least a portion of the oxidation barrier layer from the first area further includes removing at least a portion of the oxidation barrier layer from the first area subsequent to the forming the second dielectric.

* * * * *

UNITED STATES PATENT AND TRADEMARK OFFICE
CERTIFICATE OF CORRECTION

| | | |
|---|---|---|
| PATENT NO. | : 6,958,265 B2 | Page 1 of 1 |
| APPLICATION NO. | : 10/663621 | |
| DATED | : October 25, 2005 | |
| INVENTOR(S) | : Robert F. Steimle | |

It is certified that error appears in the above-identified patent and that said Letters Patent is hereby corrected as shown below:

In Column 9, Line 16, Claim No. 6:

Change "suicide" to --silicide--

In Column 10, Line 6, Claim No. 19:

Change "C." to --C-- (remove period)

Signed and Sealed this

Thirteenth Day of March, 2007

JON W. DUDAS
*Director of the United States Patent and Trademark Office*